United States Patent
Michel et al.

(10) Patent No.: US 6,597,556 B1
(45) Date of Patent: Jul. 22, 2003

(54) CIRCUIT FOR PROTECTION FROM EXCESS TEMPERATURE

(75) Inventors: Hartmut Michel, Reutlingen (DE); Christian Pluntke, Hechingen (DE); Manfred Thanner, Wannweil (DE); Bernd Bireckoven, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/424,478

(22) PCT Filed: Mar. 19, 1998

(86) PCT No.: PCT/DE98/00809
§ 371 (c)(1),
(2), (4) Date: Jun. 1, 2000

(87) PCT Pub. No.: WO98/54838
PCT Pub. Date: Dec. 3, 1998

(30) Foreign Application Priority Data

May 28, 1997 (DE) .......................... 197 22 300

(51) Int. Cl.⁷ .............................. H02H 5/04; H02H 7/00
(52) U.S. Cl. ..................... 361/103; 361/104; 361/93.8
(58) Field of Search ................................ 361/103, 104, 361/93.8; 323/907

(56) References Cited

U.S. PATENT DOCUMENTS

| | | | |
|---|---|---|---|
| 4,345,218 A | 8/1982 | Congdon et al. | 330/298 |
| 5,045,964 A | 9/1991 | Bennett et al. | 361/254 |
| 5,418,674 A | 5/1995 | Davies et al. | 361/18 |
| 5,424,897 A * | 6/1995 | Mietus et al. | 361/103 |
| 5,497,285 A * | 3/1996 | Nadd | 327/405 |
| 5,563,759 A * | 10/1996 | Nadd | 361/101 |
| 5,568,350 A * | 10/1996 | Brown | 361/104 |
| 5,638,246 A * | 6/1997 | Sakamoto et al. | 361/103 |
| 5,642,252 A * | 6/1997 | Sakamoto et al. | 361/93.9 |
| 5,805,403 A * | 9/1998 | Chemla | 337/302 |
| 6,057,998 A * | 5/2000 | Sakamoto et al. | 361/78 |

FOREIGN PATENT DOCUMENTS

DE 195 19 477 11/1996 ........... H01L/23/62

* cited by examiner

Primary Examiner—Bao Q. Vu
(74) Attorney, Agent, or Firm—Kenyon & Kenyon

(57) ABSTRACT

An integrated circuit having a power transistor and a circuit arrangement functioning in a temperature dependant manner and thermally coupled to the power transistor. The integrated circuit is used to reliably disconnect the power transistor in the event of overheating., particularly in the case of inductive loads, and does not reactivate the power transistor until, for example, an edge change has occurred at the base terminal of the integrated circuit.

19 Claims, 5 Drawing Sheets

CIRCUIT FOR PROTECTION FROM EXCESS TEMPERATURE

FIELD OF THE INVENTION

The present invention relates to an integrated circuit having a power transistor and a circuit arrangement. The circuit arrangement functions in a temperature dependent manner and is thermally coupled to the power transistor.

BACKGROUND INFORMATION

An overtemperature circuit is described in German Patent No. 195 19 477 in which the power transistor is continuously limited at high temperatures. If the acceptable base temperature of a surface-mounted power transistor is below the trip threshold of the overtemperature fuse, a one-time entry into this range by high self-heating must not result in the melting of the base-side solder layer; however a repeated operation must indeed do so. For that reason it is desirable to provide appropriate "tripping strategies."

SUMMARY OF THE INVENTION

In contrast, an advantage of the integrated circuit according to the present invention is that it ensures overtemperature protection for power transistors at temperatures of about 200° C. with high precision, thus reliably protecting the component while not constricting its range of use and being suitable for low base temperatures (in surface-mounting). The provision of a first latching circuit results in reliable functioning of the integrated circuit even with variable inductive loads. Thus, the same protective circuit can be used for variously dimensioned inductive loads that are operated via the power transistor to be protected.

It is advantageous if, after the component temperature, for example, the temperature of the base-collector transition of the power transistor, has exceeded an upper temperature threshold and the first latching circuit has disconnected the power transistor, the power transistor cannot be reactivated after falling below the upper temperature threshold until after an edge change has taken place at the base terminal. Particularly in the malfunction of long make-times, i.e., extended times of activation of the power transistor via the base terminal, it is ensured that the base temperature never exceeds an upper limit lying below the upper temperature threshold of the component temperature.

If, in addition, the integrated circuit has a spark suppression component, a break spark occurring under inductive loads can be advantageously suppressed in the event of an overtemperature disconnection. Such a break spark, for example, on the secondary winding of an ignition coil would otherwise endanger the operational reliability of the circuit, since firing pulses may only occur at defined points in time in the ignition area, particularly in motor vehicle applications.

The provision of a control transistor makes it possible to couple the latching circuit to the power transistor in a simple manner.

The advantage of a second latching circuit, particularly with high-frequency activation of the power transistor, is that a reclosing of the power transistor after an overtemperature disconnection is not possible until the component temperature has fallen below a lower temperature threshold.

Falling below the lower temperature threshold can be detected in an advantageous manner by a second temperature sensor which, for example, is optimized in a lower temperature range.

In an advantageous manner, the output of the first latching circuit is connected to the base of a transistor, the collector current of which, for example, triggers a change in the base current of the power transistor via the control transistor.

The first and/or second latching circuit can be implemented in a simple manner as an RS flipflop circuit.

If the first temperature sensor is configured as a sensor transistor, the base-emitter channel of which is interconnected with a temperature-dependent sensor resistor with a positive temperature coefficient, then high component temperatures over 200° can be reliably detected.

DETAILED DESCRIPTION

Figures 1, 1A:
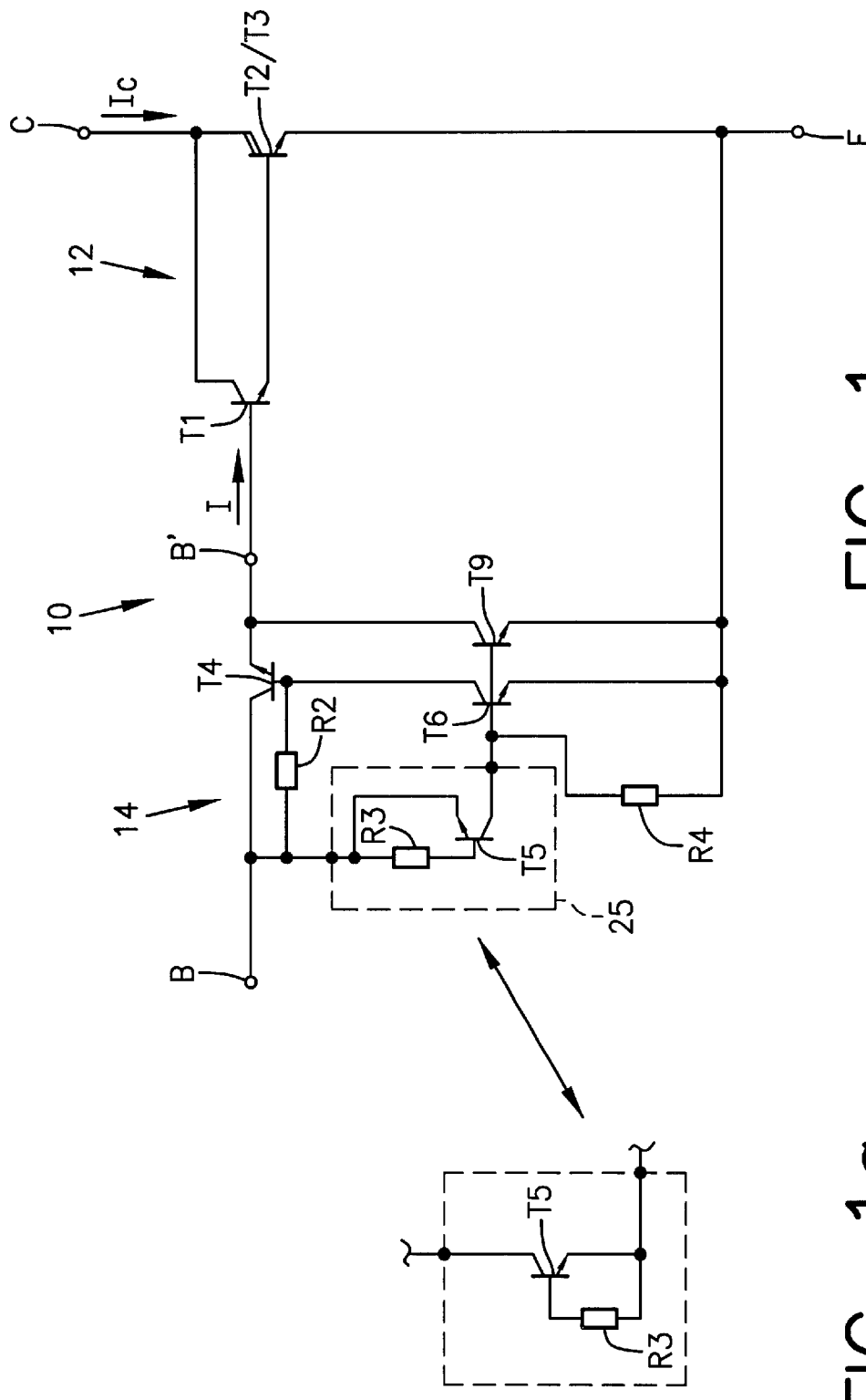
FIG. 1 shows a conventional integrated circuit.
FIG. 1a shows a conventional integrated circuit.

FIG. 1 shows a conventional integrated circuit, which is identified in its entirety as 10. Intergrated circuit 10 has a power transistor 12 and a circuit arrangement 14, which is interconnected in detail as follows. Integrated circuit 10 has a collector terminal C, a base terminal B and an emitter terminal E. Power transistor 12 is formed by transistors T1, T2 and T3 which are interconnected in a Darlington arrangement. Transistors T1, T2 and T3 are configured as npn transistors. Circuit arrangement 14 has transistors T4, T5 and T6, transistor T5 is configured as a pnp or npn transistor and transistors T4 and T6 as npn transistors. Base terminal B is connected to the collector of transistor T4. The emitter of transistor T4 is connected to the base of transistor T1. The collector of transistors T1, T2 and T3 is connected to collector terminal C. The emitter of transistor T1 is connected to the base of transistor and the emitter of transistor T2 is connected to the base of transistor T3. The emitter of transistor T3 is connected to emitter terminal E. The base of transistor T5 is connected to the emitter of transistor T5 via a resistor R3. Together, resistor R3 and transistor T5 constitute a first temperature sensor 25. Resistor R3 is configured as a temperature-dependent resistor, for example, having a positive temperature coefficient. Moreover, the collector of transistor T4 is connected to the emitter of transistor T5 in the case of a pnp transistor, or otherwise to the collector of transistor T5 in the case of an npn transistor (FIG. 1a) and to the collector of transistor T6 via resistor R2. Moreover, the collector of transistor T6 is connected to the base of transistor T4. The collector of transistor T5, in the case of the pnp transistor, or otherwise the emitter of transistor T5, in the case of the npn transistor, is connected to the base of transistor T6 and emitter terminal E via resistor R4. The emitter of transistor T6 is also connected to emitter terminal E. The base of a transistor T9 is connected to the base of transistor T6. The collector of transistor T9 is connected to the emitter of transistor T4; the emitter of transistor T9 is connected to emitter terminal E of the integrated circuit.

Integrated circuit 10 performs the following function. During normal operation of integrated circuit 10, a load can be connected between collector terminal C and emitter terminal E via power transistor 12; for example, an ignition coil designed as an autotransformer is connected to collector terminal C. Power transistor 12 is activated via transistor T4, which is connected "longitudinally" between base terminal B and the base of transistor T1. Consequently, base current I of power transistor 12 can be influenced via transistor T4. Temperature sensor 25 feeds a reverse current, which increases with temperature, into resistor R4. The higher the current, the more strongly transistor T6 is activated and the activation of transistor T4 is withdrawn to a similar degree so that power transistor 12 is increasingly limited with increasing temperature even with a control signal present at base terminal B. Despite a limited power transistor 12, the source voltage of the base supply of integrated circuit 10 is present at the collector of transistor T4; thus it is brought about that, despite a limited power transistor 12, circuit arrangement 14 and consequently transistor T5, which is connected as a thermal sensor element, have an adequately high driving voltage available to them. The selection of resistor R3 and transistor T5 results in the specific type of thermal limitation which, for example, occurs only at very high temperatures, which may be above 200° C. Transistor T9 is also activated by the reverse current of transistor T5 and it improves the limitation of power transistor 12, particularly at high temperatures above 200° C.

Figure 2:
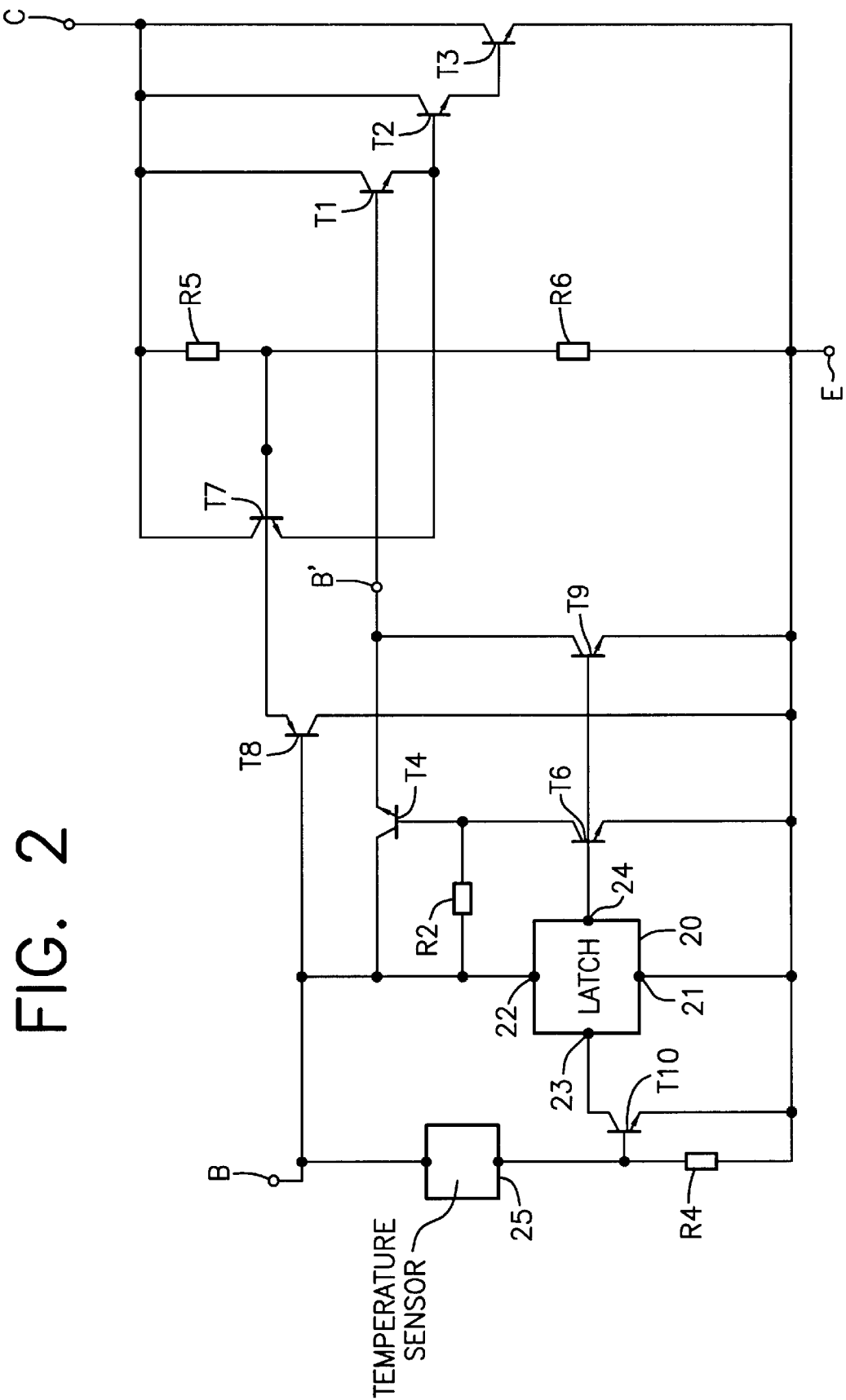
FIG. 2 shows a first embodiment of the present invention.

FIG. 2 shows a first exemplary embodiment of the invention. The same elements as in FIG. 1 are provided with the same reference numerals and will not be described again. The circuit according to FIG. 2 has a first latching circuit 20 possessing an input 23, an output 24, a first voltage terminal 21 and a second voltage terminal 22. First voltage terminal 21 is connected to emitter terminal E of the integrated circuit; second voltage terminal 22 is connected to base terminal B of the integrated circuit. In contrast to FIG. 1, the terminal of temperature sensor 25 facing away from the base terminal of the integrated circuit is not connected directly to the base of transistor T6, but rather to the base of a transistor T10. The emitter of transistor T10 is connected to emitter terminal E of the integrated circuit; the collector of transistor T10 is connected to input 23 of first latching circuit 20. The base of transistor T6 is now connected to output 24 of first latching circuit 20. In addition, the circuit has a spark suppression component (T8, T7, R5, R6). Collector terminal C and emitter terminal E are connected to the two resistors R5 and R6 via a voltage divider. The pick-off of the voltage divider is connected to the base of npn transistor T7, the collector of which is in turn connected to collector terminal C and the emitter of which is connected to the emitter of part transistor T1 of the power transistor. The base of transistor T7 is also connected to the emitter of pnp transistor T8, the collector of which is connected to emitter terminal E of the integrated circuit and which is activated via a control signal present at base terminal B. The base terminal of the power transistor is identified as B' in FIG. 2. For instance, an inductive load is connected to collector terminal C and in addition, a Zener diode is optionally connected between the collector terminal and the emitter of second part transistor T2. The negative pole of the Zener diode is present at the collector terminal. First latching circuit 20 is in the form of an RS flipflop circuit in a example embodiment. The voltage supply of the flipflop of the first latching circuit is provided by the base-emitter voltage of the integrated circuit via first and second voltage terminal 21 and 22, respectively, and second voltage terminal 22 is connected to the reset input of the RS flipflop, input 23 is connected to the set input of the RS flipflop and output 24 is connected to the Q output of the RS flipflop.

Figure 3:
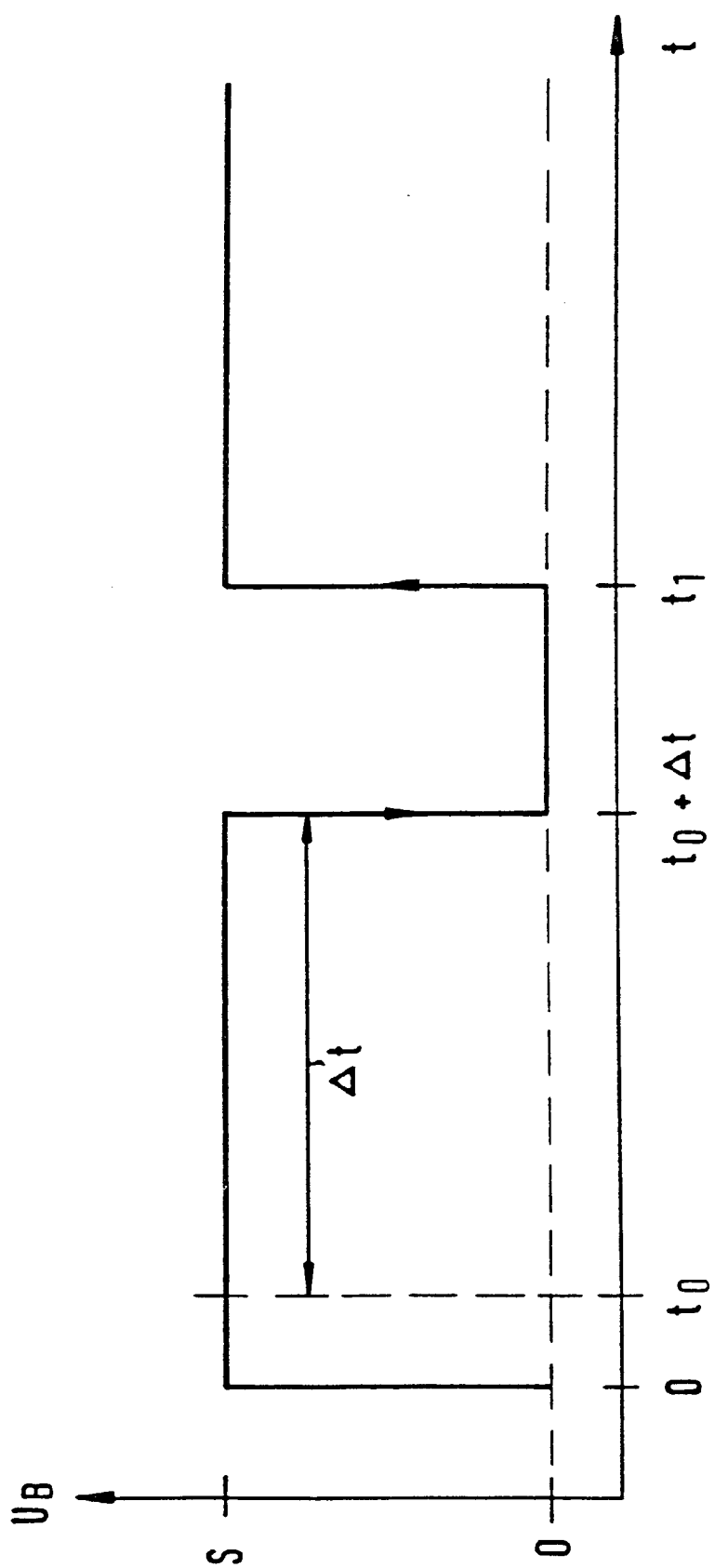
FIG. 3 shows a timing diagram of a base signal.

In order to make the mode of functioning of the circuit according to FIG. 2 understandable, a base signal $U_B$ present at base terminal B is shown in FIG. 3 by way of an example. Base signal $U_B$ is used as a control signal for the power transistor and simultaneously for the first latching circuit. Base signal $U_B$ switches between the values S and, for example, zero and is at S in the time span between the time t=0 and t=$t_0$+$\Delta t$, and at zero between $t_0$+$\Delta t$ and $t_1$. In this connection, $t_0$ marks the time of the overtemperature disconnection by the first latching circuit 20 and $\Delta t$ is the minimum time span available for cooling. For example $t_0$+$\Delta t$ is a long make-time, which may result in damage to the circuit without overtemperature disconnection by latching circuit 20. $t_1$ marks the time of the positive edge change. $t_0$+$\Delta t$ marks the time of the negative edge change. If the circuit is now integrated in a component mounted on a surface, it must be ensured that an acceptable base temperature, 150° C. for example, is not exceeded during operation in order that no damage occurs to the circuit board, for example, on which the component is mounted, or even that unsoldering does not take place. This temperature limit does not mean that the integrated circuit itself might not exceed this temperature. Only above an upper temperature threshold $T_{jmax}$, which is higher than the maximum acceptable base temperature, must the integrated circuit be disconnected so that neither the component itself nor the circuit board to which the component is attached is damaged. Moreover, the danger of the component becoming unsoldered from the circuit board is eliminated. If the component temperature $T_j$ exceeds the upper temperature threshold $T_{jmax}$, first temperature sensor 25 delivers a current of such magnitude that transistor T10 is activated and the RS flipflop of first latching circuit 20 is set from its preferred position 0 to 1 at its output 24. As a result, transistors T6 and T9 are activated and the control of control transistor T4 is withdrawn so that the power transistor is disconnected. If component temperature $T_j$ falls below the upper temperature threshold, the power transistor remains disconnected for the time being since the RS flipflop leaves the signal at output 24 unchanged despite the changed input signal at input 23. Only when an edge change takes place after the time $t_0$ of the overtemperature disconnection, i.e., the activation at base terminal B of the integrated circuit in the example of FIG. 3 is withdrawn, is the RS flipflop reset and the power transistor reactivated with a new edge change at time $t_1$. First latching circuit 20 ensures that the power transistor has a sufficiently long cooldown time $\Delta t$ available to it, particularly in the case of long make-times $t_0$+$\Delta t$, which represent a malfunction. With a continuous limiting as in the circuit according to FIG. 1, on the other hand, particularly in the case of long make-times of the integrated circuit despite less activation of the power transistor with increasing temperature as a consequence of the thermal limiting, it is not ensured that the base temperature will remain below an acceptable limiting value of, for example 150° C., since a further heating of the base can take place despite a limiting and the base temperature increasingly approximates the component temperature, which may indeed be higher than the maximum acceptable base temperature.

When used as a switch of inductive loads in ignition applications, the temperature-related disconnection results in voltage overshoots at collector terminal C, which can result in unexpected sparking. Therefore, the clamping voltage level between the collector and emitter terminal of the integrated circuit must switch automatically from the customary 400 volts to values of typically 30 volts. This break spark suppression via the spark suppression component (T8, T7, R5, R6) is enabled by the control signal still present at the base terminal after the power transistor is switched off by the a first latching circuit, and continues to remain active until the coil energy has been converted by biasing the triple Darlington transistor into conduction as power loss at a voltage that is provided by the divider ratio RS to R6 (e.g., 30 V). In normal operation, the spark suppression component is blocked and the customary clamping voltage for ignition applications (e.g., 400 V if, for example, a Zener diode is connected between collector terminal C and the emitter of T2) is available. In detail, the break spark suppression functions as follows: In the event of overtemperature disconnection by first latching circuit 20, a control signal continues to be present at base terminal B. Due to the magnetic induction in the ignition coil, the voltage increases at collector terminal C, consequently the voltage drops at resistor R6 until transistor T7 is activated, as a result of which the power transistor is biased into conduction at the base of transistor T2 via the collector-emitter channel of transistor T7; thus in a malfunction of the overtemperature disconnection, the power transistor is operated at a second base via the spark suppression component. A proper selection of resistors R5 and R6 ensures that the voltage at collector terminal C does not exceed 30 volts, for example, in a malfunction of the overtemperature disconnection. However, if base terminal B of the integrated circuit is connected to ground (input "low"), transistor T8 is connected to be conductive and the base of transistor T7 is approximately connected to ground via transistor T8. This means that transistor T7 is blocked in this case and the power transistor cannot be activated via T7, i.e., with an intentional disconnection at input B the spark suppression component is blocked. However, if a control signal is present at base terminal B of the integrated circuit, transistor T8 is blocked. The base of transistor T7 is not connected to ground. In normal operation, the collector terminal has a low potential and T7 remains blocked. In the case of an overtemperature disconnection by first latching circuit 20, however, the power transistor is disconnected via part transistor T1 and the potential at collector terminal C increases so that finally the power transistor is biased into conduction for break spark suppression and reduction of the coil energy via the base of part transistor T2 if the potential of the collector terminal has, for example, exceeded 30 volts. The advantage of the circuit according to FIG. 2 is thus reliable protection of surface-mountable power components against solder degradation and unsoldering in malfunctions of extended make-times in which the short-time acceptable component temperature $T_{jmax}$ is higher than the maximum acceptable base temperature. The disconnection with only a slight voltage overshoot at the collector of the power transistor when used as a switch for inductive loads reliably prevents unintended sparking in ignition applications. The enabling of the component only occurs with an edge change at base terminal B. Thus the end stage is not immediately activated again after the temperature falls below the upper temperature threshold.

Figure 4:
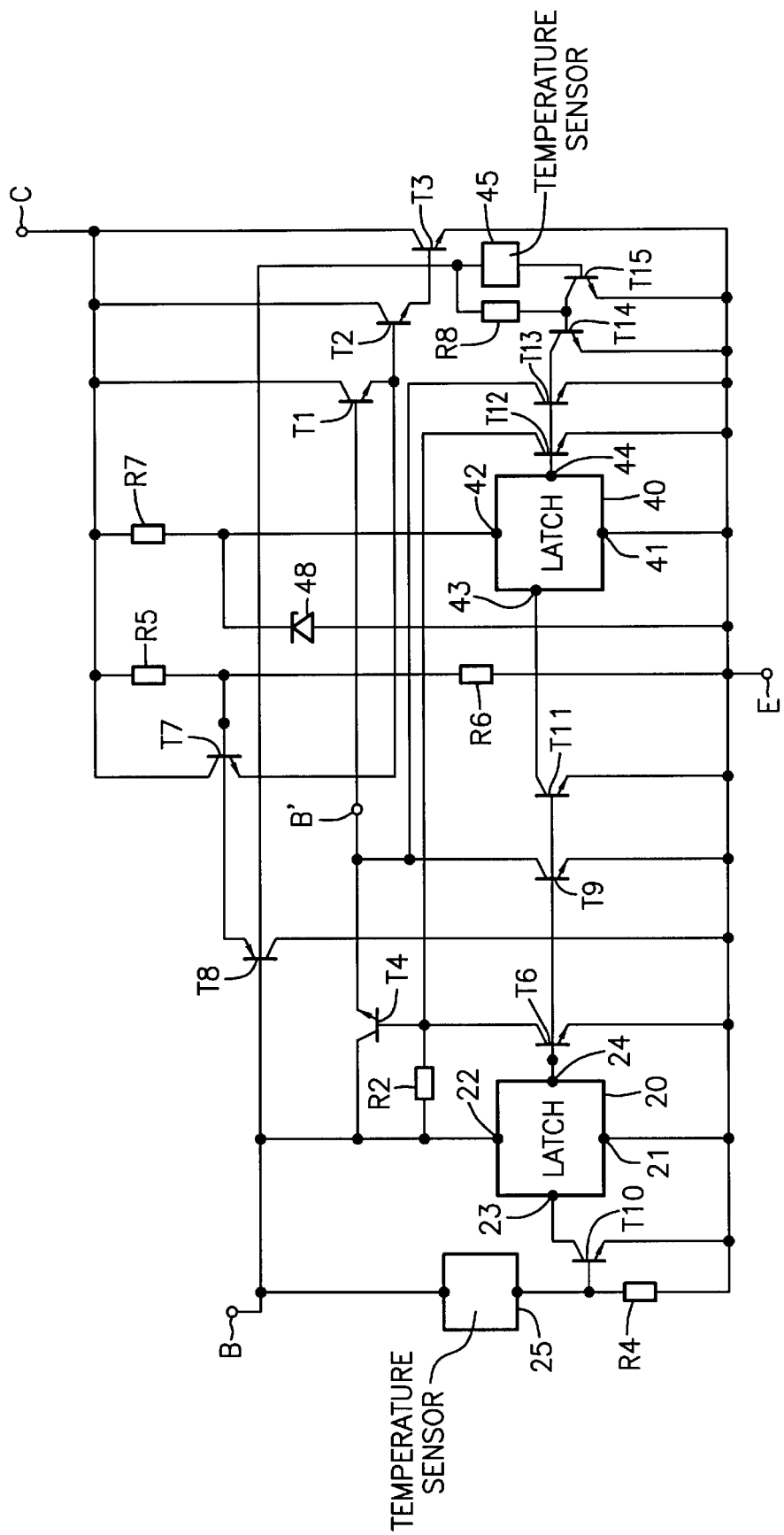
FIG. 4 shows a second embodiment of the present invention.

FIG. 4 shows an additional embodiment of the invention. Compared to FIG. 2, the circuit according to FIG. 4 has additional circuit parts. A second latching circuit 40 is provided that is connected via its additional input 43 to the collector of transistor T11, the emitter of which is connected to the emitter terminal of the integrated circuit and the base of which is connected to output 24 of first latching circuit 20. Third voltage terminal 41 of second latching circuit 40 is connected to emitter terminal E; fourth voltage terminal 42 is connected to collector terminal C of the integrated circuit via a resistor R7. In addition, fourth voltage terminal 42 is connected to emitter terminal E of the circuit via a protective Zener diode 48, the negative pole of the Zener diode is connected to resistor R7. Additional output 44 of second latching circuit 40 is connected to the base of a transistor T12, the emitter of which is connected to the emitter terminal of the integrated circuit and the collector of which is connected to the base of control transistor T4. Additional output 44 is also connected to the base of a transistor T13, the emitter of which is connected to the emitter terminal of the integrated circuit and the collector of which is connected to the emitter of control transistor T4. In addition, a second temperature sensor 45 is provided that is connected to base B. In the embodiment shown, this temperature sensor, just like first temperature sensor 25, delivers an increasingly stronger current as the temperature increases. Temperature sensor 45 is also connected to the base of a transistor T15, the collector of which is connected to a resistor R8 which is in turn connected to base B. The emitter of transistor T5 is connected to the emitter terminal of the integrated circuit. The collector of transistor T15 is in contact with the base of transistor T14, the collector of which is connected to additional output 44 of second latching circuit 40 and the emitter of which is connected to emitter terminal E of the integrated circuit.

Second latching circuit 40 is used to disconnect and lock the power transistor at the first startup of the overtemperature protection of the power transistor provided by the first latching circuit and the first temperature sensor so that the overtemperature disconnection is not reversed even with an edge change at the base terminal of the integrated circuit, i.e., after a disconnection and reclosing, as long as the temperature of the power transistor is above a lower temperature threshold (hysteresis). The second latching circuit ensures this without additional supply terminals. Just as in the circuit according to FIG. 1 or FIG. 2, the circuit according to FIG. 4 also has only three terminals, namely a base, collector and emitter terminal. If the overtemperature disconnection is made active by the first latching circuit, this information is sent via transistor Til to second latching circuit 40, which can be configured as an RS flipflop circuit by analogy to the first latching circuit. As a result, transistors T12 and T13 are activated if the upper temperature threshold is exceeded in a manner analogous to transistor T6 and transistor T9. In contrast tu second voltage terminal 22 of first latching circuit 20, the fourth voltage terminal of second latching circuit 40 is not connected to base terminal B, but rather to collector terminal C (via a resistor R7). In addition, protection Zener diode 48 protects the second latching circuit against voltages greater than 10 volts, for example. After an overtemperature disconnection, the first latching circuit is reset following an edge change at the base terminal, as a result of which transistors T6 and T9 enter the blocking state and thus the power transistor could again be activated via base terminal B if the disconnection was not maintained via transistors T12 and T13. Second latching circuit 40 has not been reset and has not returned to the preferred position "low" at output 44. Only if the temperature has fallen below a lower temperature threshold, which is lower than the upper temperature threshdold, and it is detected by second temperature sensor 45, does transistor T15 pass from the conductive to the blocked state. Transistor T14 behaves in a complementary manner to T15 and sets the bases of transistors T12 and T13 to "low" if base terminal B of the integrated circuit is activated, i.e., they are disconnected so that the power transistor can again be activated via control transistor T4. However, as long as the temperature of the component is above the lower temperature threshold, the second temperature sensor delivers enough current that T15 conducts or T14 blocks and thus transistors T12 and T13 stay in a conductive state.

If one cycle of the component is observed with overheating (a), disconnecting (b), cooling (c) and reclosing (d), the following circuit states occur:

a. Base terminal B is activated, transistor T4 is conductive and delivers base current to power Darlington T1, T2, T3. While absorbing a high power loss, the latter passes into a current limiting which is not explicitly shown in FIG. 4. The first temperature sensor, transistor T6 and transistor T9 as well as transistor T12 and transistor T13 are initially not active. The second temperature sensor and transistor T15 are inactive below the lower temperature threshold and active above it. In transistors, active means that they are switched into the conductive state; in temperature sensors, active means that they deliver a high current due to a detected high temperature. Transistor T14 behaves in a complementary manner to T15. The first and the second latching circuits are thus in the preferred position "low" at their outputs 24 and 44, respectively.

b. The first temperature sensor actuates the first latching via resistor R4 and transistor T10. As a result, transistors T6, T9 and T11 are biased into conduction, the power transistor disconnects and the second latching is also triggered. Therefore, transistors T12 and T13 are also biased into conduction. The base current of transistors T12 and T13 is delivered by collector terminal C via the second latching circuit.

c. The power transistor cools down again. If an edge change now takes place at base terminal B above the lower temperature threshold, the following situation results: the first latching is reset to the preferred position; transistors T6, T9 and T11 block. The second latching stays triggered since it is continuously supplied by collector terminal C. Transistors T12, T13, T15 are conductive. Transistor T14 blocks; the output of the second latching stays "high." The power transistor cannot yet be reclosed.

d. If the component temperature falls below the lower temperature threshold, the second temperature sensor becomes inactive; T15 blocks; T14 conducts with base terminal B activated. As a result, transistors T12 and T13 are blocked and input B' of the power transistor is enabled. With an inductive load (ignition coil), the potential at collector terminal C becomes zero; as a result, the second latching is also reset to the preferred position. This completes the cycle.

The second temperature sensor, which is designed for a different range, e.g., 150° C., than the first temperature sensor may be based on a completely different principle, e.g., the analysis of a diode flow characteristic. The described cycle illustrates that the monolithic integration of a sophisticated overtemperature protection in a three-pole power transistor is made possible with the circuit shown in FIG. 4, the power transistor maintaining the disconnect information in the event of an overtemperature via the edge change at the input by utilizing the collector voltage.

Figure 5:
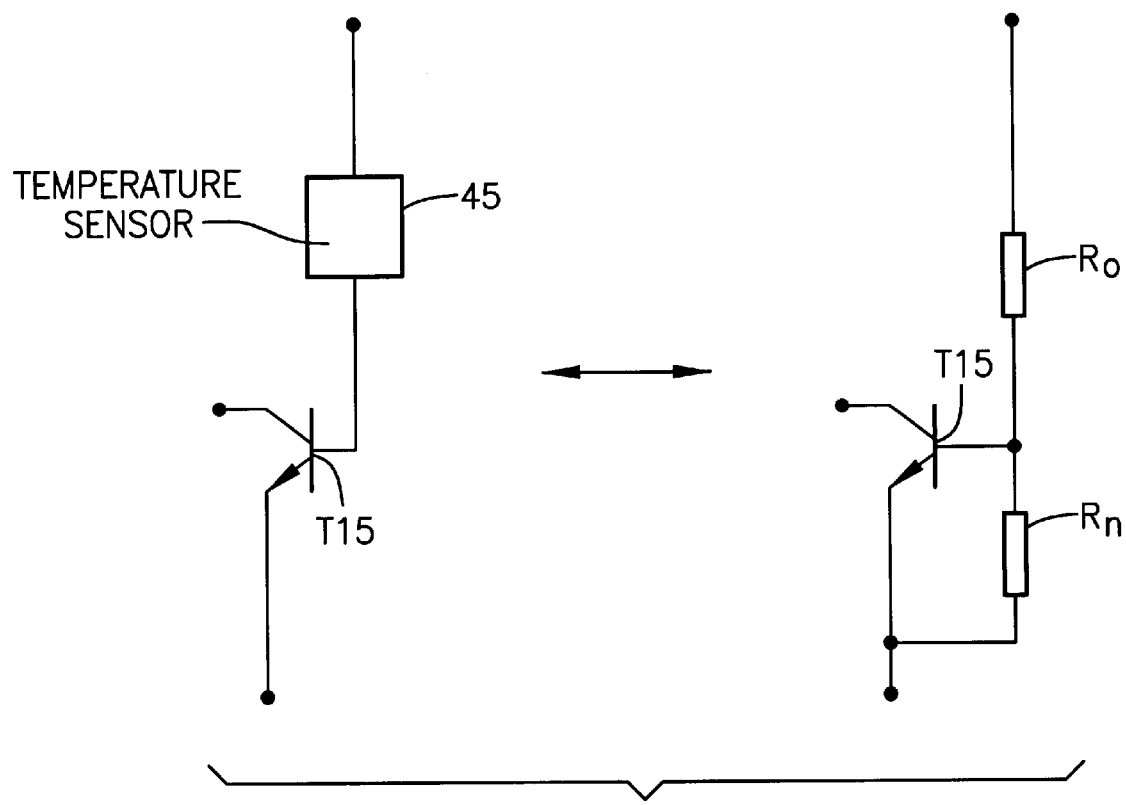
FIG. 5 shows a portion of the second embodiment illustrated in FIG. 4.

To the left, FIG. 5 shows the three-pole arrangement formed from transistor 15 and second transistor 45 as it is used in FIG. 4. In a simple embodiment, this three-pole arrangement can be formed by a three-pole arrangement as shown on the right side of FIG. 5. In it, a resistor Ro and a resistor Rn are connected in series; the pick-off of the voltage divider is connected to the base of transistor T15. Resistor Rn is connected in parallel to the base-emitter channel of transistor T15; resistor Ro is connected to base terminal B, which is shown in FIG. 4. A temperature-dependent voltage drops at resistor Rn, the voltage (at a switching point of 150 degrees Celsius, for example) having a bandwidth of approximately plus/minus 25 mV at a tolerance of the voltage at base terminal B of plus/minus five percent, corresponding to approximately plus/minus 10 degrees Kelvin. This is adequate for the application. When the power transistor is closed, the voltage at B drops somewhat as a result of the internal resistance of the source of the signal present at B, as a result of which the switching of transistor T15 is supported.

What is claimed is:

1. An integrated circuit, comprising:
   a power transistor including a base, a collector and an emitter;
   a circuit arrangement thermally coupled to the power transistor, the circuit arrangement operating in a temperature dependent manner and including a first latching circuit, the first latching circuit including a first voltage terminal and a second voltage terminal, the first latching circuit activatable via a first temperature sensor, a disconnection of the power transistor being triggerable by a temperature signal from the first temperature sensor when a temperature rises above an upper temperature threshold, the disconnection being deactivated only by a control signal present at the first latching circuit when the temperature falls below the upper temperature threshold;
   a base terminal connected to the second voltage terminal, a signal present at the base terminal forming the control signal;
   a collector terminal connected to the collector of the power transistor and the first voltage terminal; and
   an emitter terminal connected to the first voltage terminal.

2. The integrated circuit according to claim 1, wherein the circuit arrangement further includes a second latching circuit, the second latching circuit receiving disconnect information from the first latching circuit and preventing a reclosing of the power transistor before the temperature falls below a lower temperature threshold detected by a second temperature sensor, the second latching circuit including a third voltage terminal and a fourth voltage terminal, the third voltage terminal being connected to the emitter terminal, the fourth voltage terminal being connected to the collector terminal via a first resistor, the second latching circuit being supplied with electrical energy via the emitter terminal and the collector terminal.

3. The integrated circuit according to claim 1, wherein the first latching circuit is deactivated by an edge change at the base terminal.

4. The integrated circuit according to claim 1, wherein the circuit arrangement further includes a spark suppression component, the spark suppression component being activated by the signal present at the base terminal, the spark suppression component preventing a limiting value of a voltage at the collector terminal from being exceeded when the power transistor is disconnected by the first latching circuit.

5. The integrated circuit according to claim 4, further comprising:
   a voltage divider, the voltage divider being connected between the collector terminal and the emitter terminal, the voltage divider having a pick-off; and
   a second transistor, the pick-off being connected to a base of the second transistor, a collector of the second transistor being connected to the collector terminal, and an emitter of the second transistor being connected to an emitter of a first part transistor of the power transistor.

6. The integrated circuit according to claim 5, further comprising:
a third transistor, the base of the second transistor being connected to the emitter terminal via a collector-emitter channel of the third transistor, a base of the third transistor being connected to the base terminal.

7. The integrated circuit according to claim 1, further comprising:
a control transistor, a collector of the control transistor being connected to the base terminal, an emitter of the control transistor being connected to a base of a first part transistor of the power transistor, a base current of the power transistor flowing via the control transistor.

8. The integrated circuit according to claim 2, further comprising:
a fourth transistor, a second input of the second latching circuit being connected to a first output of the first latching circuit via the fourth transistor.

9. The integrated circuit according to claim 2, further comprising:
a control transistor, a collector of the control transistor being connected to the base terminal, an emitter of the control transistor being connected to a base of a first part transistor of the power transistor, a base current of the power transistor flowing via the control transistor; and
a fifth transistor, a base of the fifth transistor being connected to a second output of the second latching circuit, a collector of the fifth transistor being connected to a base of the control transistor.

10. The integrated circuit according to claim 9, further comprising:
a sixth transistor, a base of the sixth transistor being connected to the second output, a collector of the sixth transistor being connected to the emitter of the control transistor.

11. The integrated circuit according to claim 9, further comprising:
a transistor link, the second temperature sensor being connected to the second output via the transistor link, activation of the fifth transistor being withdrawn when the temperature falls below the lower temperature threshold detected by the second temperature sensor.

12. The integrated circuit according to claim 1, further comprising:
a first transistor, a base of the first transistor being connected to a first output of the first latching circuit, a collector current of the first transistor triggering a change in a base current of the power transistor.

13. The integrated circuit according to claim 7, further comprising:
a first transistor, a base of the first transistor being connected to a first output of the first latching circuit, a collector of the first transistor being connected to a base of the control transistor, a collector current of the first transistor triggering a change in a base current of the power transistors.

14. The integrated circuit according to claim 1, further comprising:
a seventh transistor, a base of the seventh transistor being connected to a first output of the first latching circuit, a collector of the seventh transistor being connected to a base of a first part transistor of the power transistor, an emitter of the seventh transistor being connected to the emitter terminal.

15. The integrated circuit according to claim 1, wherein the first latching circuit further includes a first RS flip-flop circuit.

16. The integrated circuit according to claim 2, wherein the second latching circuit further includes a second flip-flop circuit.

17. The integrated circuit according to claim 15, wherein a first voltage supply of the first RS flip-flop is provided by a base-emitter voltage of the integrated circuit via the first voltage terminal and the second voltage terminal, a reset input of the first RS flip-flop is connected to the second voltage terminal, a set input of the first RS flip-flop is connected to a first input of the first latching circuit, and a Q output of the first RS flip-flop is connected to a first output of the first latching circuit.

18. The integrated circuit according to claim 16, wherein a second voltage supply of the second RS flip-flop is provided by a collector-emitter voltage of the integrated circuit via the third voltage terminal and fourth voltage terminal, a second reset input of the second is connected to the fourth voltage terminal, a second set input of the second RS flip-flop is connected to a second input of the second latching circuit, and a second Q output of the RS flip-flop is connected to the second output of the second latching circuit.

19. The integrated circuit according to claim 1, wherein the first temperature sensor includes a sensor transistor, the sensor transistor having a base-emitter channel, the base-emitter channel being interconnected with a temperature-dependent sensor resistor having a positive temperature coefficient.

* * * * *

UNITED STATES PATENT AND TRADEMARK OFFICE
CERTIFICATE OF CORRECTION

PATENT NO.    : 6,597,556 B1
DATED         : July 22, 2003
INVENTOR(S)   : Hartmut Michel et al.

It is certified that error appears in the above-identified patent and that said Letters Patent is hereby corrected as shown below:

Title page,
Item [57], ABSTRACT,
Line 2, change "dependant" to -- dependent --
Line 3, change "transitor" to -- transistor --
Line 5, change "overheating.," to -- overheating, --

Column 2,
Line 41, change "base of transistor and" to -- base of transistor $T_2$, and --

Column 5,
Line 1, change "the a first latching circuit," to -- the first latching circuit, --

Column 6,
Line 36, change "via transistor Til" to -- via transistor T11 --

Signed and Sealed this

Eighteenth Day of January, 2005

JON W. DUDAS
*Director of the United States Patent and Trademark Office*